(12) United States Patent
Shimooka (10) Patent No.: US 7,716,545 B2
(45) Date of Patent: *May 11, 2010

(54) SEMICONDUCTOR INTEGRATED CIRCUIT AND METHOD FOR CONTROLLING THE SAME

(75) Inventor: Masaaki Shimooka, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 504 days.

This patent is subject to a terminal disclaimer.

(21) Appl. No.: 11/634,081

(22) Filed: Dec. 6, 2006

(65) Prior Publication Data

US 2007/0150780 A1 Jun. 28, 2007

(30) Foreign Application Priority Data

Dec. 8, 2005 (JP) ............................. 2005-354492

(51) Int. Cl.
*G01R 31/28* (2006.01)
(52) U.S. Cl. ..................................................... 714/726
(58) Field of Classification Search ................. 714/724, 714/726, 733, 734, 30, 731, 13, 14, 22
See application file for complete search history.

(56) References Cited

U.S. PATENT DOCUMENTS

| | | | |
|---|---|---|---|
| 4,929,483 A | | 5/1990 | Hälg et al. |
| 5,092,947 A | | 3/1992 | Hälg et al. |
| 5,333,274 A | * | 7/1994 | Amini et al. ................... 714/50 |
| 5,381,538 A | * | 1/1995 | Amini et al. ................. 711/156 |
| 5,548,786 A | * | 8/1996 | Amini et al. ................... 710/22 |
| 5,551,009 A | * | 8/1996 | Amini et al. ................. 711/165 |
| 5,784,548 A | * | 7/1998 | Liong et al. ..................... 714/6 |
| 6,212,656 B1 | * | 4/2001 | Fosco et al. ................. 714/726 |
| 6,370,640 B1 | * | 4/2002 | Dowling ...................... 712/228 |
| 6,370,664 B1 | * | 4/2002 | Bhawmik .................... 714/729 |
| 2004/0153762 A1 | | 8/2004 | Flynn et al. |

(Continued)

FOREIGN PATENT DOCUMENTS

JP 5-217392 A 8/1993

(Continued)

OTHER PUBLICATIONS

Korean Office Action dated Nov. 21, 2007, with partial English translation.

(Continued)

*Primary Examiner*—Phung M Chung
(74) *Attorney, Agent, or Firm*—McGinn IP Law Group, PLLC (57) ABSTRACT

A semiconductor integrated circuit includes a target circuit with at least a scan chain having sub scan chains of stages to sequentially shift a test data in response to a clock signal in a scan path test mode, and each of the sub scan chains includes first flip-flops connected in series. A backup control circuit controls the target circuit and a memory such that a plurality of sub internal state data of a data indicating an internal state of the target circuit are stored as a plurality of write data in the memory in a save mode through the sub scan chains and the plurality of sub internal state data are read out from the memory as a plurality of read data and set in the sub scan chains in a restore mode.

31 Claims, 9 Drawing Sheets

U.S. PATENT DOCUMENTS

2005/0149799 A1    7/2005   Hemia et al.
2008/0092002 A1*   4/2008   Shimooka ................... 714/731

FOREIGN PATENT DOCUMENTS

| JP | 6-52070 | 2/1994 |
| JP | 10-78836 | 3/1998 |
| KR | 2003-0014216 | 2/2003 |
| WO | WO 2005/054884 A1 | 6/2005 |

OTHER PUBLICATIONS

Japanese Office Action dated May 15, 2008 with Partial English Translation.

Japanese Office Action dated Jan. 13, 2009 with Partial English-Language Translation.

* cited by examiner

SEMICONDUCTOR INTEGRATED CIRCUIT AND METHOD FOR CONTROLLING THE SAME

BACKGROUND OF THE INVENTION

1. Field of the Invention

The present invention pertains to a semiconductor integrated circuit and a method for controlling thereof. In particular, the present invention pertains to a semiconductor integrated circuit including a circuit that saves and restores the internal state of the semiconductor integrated circuit and a method for controlling the semiconductor integrated circuit.

2. Description of the Related Art

Recently, a semiconductor integrated circuit having low power consumption functions of a standby function and a resume function is noted. Usually, when the power supply to the semiconductor integrated circuit is stopped, an internal state is lost excluding a nonvolatile memory. Therefore, it is necessary to hold the internal state in order to restart the operation of the circuit from the state immediately before the power supply of the circuit is stopped, when the power supply is restarted. For example, in Japanese Laid Open Patent Application (JP-A-Heisei 6-52070) a conventional integrated circuit is disclosed which saves and holds the internal state data held in registers in an external memory when the power supply is stopped. The conventional integrated circuit has a plurality of registers, a data saving unit, and a data restoring unit. The plurality of registers are connected to form a scan chain, and the data saving unit controls the plurality of registers to form the scan chain in a data save mode in response to an external signal, and reads the data held in each register outside through the formed scan chain. At this time, the data saving unit carries out series/parallel conversion on the internal state data into a data of predetermined bits width, and stored the data in a data protection memory through a data I/O unit. The data restoring unit controls the registers to form the scan chain in a data restoration mode in response to an external signal, and returns the saved data through the formed scan chain to the original registers. At this time, the data restoring unit reads the internal state data from the data protection memory through the data I/O unit, and converts the data of the predetermined bit width into the original internal state data, which are set in the registers through the scan chain.

Also, in US Laid Open Patent application (US 2004/0153762A1), a conventional data processing system is disclosed which includes a node circuit having one node or a plurality of nodes, a memory, a system bus, and a state saving controller. The node circuit is used to process data, and stores one data value or a plurality of data values that defines the state of the node circuit as a whole. The memory stores the data. The system bus is connected to the node circuit and the memory, and transmits multiple bit data word between the node circuit and the memory in response to a memory transfer request supplied to the system bus during a usual processing operation of the node circuit and the memory. The state saving controller connects the node circuit and the system bus in response to a save trigger, reads the data values that defines the state of the node circuit from the node or the plurality of nodes, and generates a sequence of a memory write request on the system bus. Furthermore, the state saving controller writes the plurality of states of the multiple bit data word that shows the data value in the memory, and then can restore the state of the node circuit by using the plurality of states of the multiple bit data words. Moreover, a relating technique is disclosed in US Laid Open Patent Publication (US 2005/0149799A).

As described above, the scan chain is composed of a plurality of registers connected in series. Therefore, it would take a long time to save and restore in serial all the data held in the registers. Moreover, it is necessary to start a memory read sequence and a memory write sequence after being granted the system bus, in order to read/write the internal node data from/to the memory through the system bus. Therefore, the saving and restoring time of the internal state still becomes so long.

SUMMARY OF THE INVENTION

In an aspect of the present invention, a semiconductor integrated circuit includes a target circuit with at least a scan chain having sub scan chains of stages to sequentially shift a test data in response to a clock signal in a scan path test mode, and each of the sub scan chains includes first flip-flops connected in series. A backup control circuit controls the target circuit and a memory such that a plurality of sub internal state data indicating an internal state of the target circuit are stored as a plurality of write data in the memory in a save mode through the sub scan chains and the plurality of sub internal state data are read out from the memory as a plurality of read data and set in the sub scan chains in a restore mode.

Here, the memory may be contained in the semiconductor integrated circuit.

Also, the semiconductor integrated circuit may include a bus interface section. The backup control circuit controls the target circuit and the memory such that the plurality of sub internal state data are extracted through the sub scan chains and are stored as the plurality of write data in the memory through the bus interface section in the save mode and the plurality of sub internal state data are read out from the memory as the plurality of read data through the bus interface section and set in the sub scan chains in the restore mode.

Also, each of the plurality of sub scan chains may include a selector section configured to select one of a plurality of inputs data which include a previous stage write data which is outputted from the sub scan chain of the stage previous to the sub scan chain of a current stage as one of the plurality of write data, and a current stage read data as one of the plurality of read data which corresponds to the sub scan chain of the current stage; and the first flip-flops connected in series after the selector section and configured to shift the selected data by the selector section in response to the clock signal.

Also, the selector section may select one of the previous stage write data, the current stage read data, and a current stage write data which is outputted from the sub scan chain of the current stage as one of the plurality of write data.

In this case, the selector section may include a first selector circuit configured to select one of the current stage read data and the current stage write data; and a second selector circuit configured to select one of the previous stage write data and the selected data by the first selector circuit.

Also, it is preferable that numbers of the first flip-flops are same over the plurality of sub scan chains.

Also, a number of pulses of the clock signal supplied to each of the plurality of sub scan chains may be determined based on the number of first flip-flops in the sub scan chain, when numbers of the first flip-flops of the plurality of sub scan chains are different.

Also, the semiconductor integrated circuit may further include second flip-flops added to some of the plurality of sub scan chains such that numbers of the flip-flops become same over the plurality of sub scan chains. In this case, at least one of the second flip-flops may be added after the first flip-flops, and may be added before the selector section.

Also, the plurality of sub scan chains may output the plurality of write data to the memory at a same time.

Also, the semiconductor integrated circuit may further include a switch configured to supply power to the target circuit when the switch is turned on in response to a first control signal, and to stop the power supply when the switch is turned off in response to a second control signal. In this case, the backup control circuit issues the second control signal to the switch after the internal state data is stored in the memory.

Also, the backup control circuit may issue the first control signal to the switch after the internal state data is set to the plurality of sub scan chains.

In another aspect of the present invention, an operation method of a semiconductor integrated circuit, is achieved by selecting one of a plurality of input data in each of a plurality of sub scan chains of a scan chain of a target circuit which sequentially shifts a test data in response to a clock signal in a scan path test mode; by storing a plurality of sub internal state data of a data indicating an internal state of the target circuit into a memory from the plurality of sub scan chains as a plurality of write data in a save mode, and by reading out the plurality of sub internal state data from the memory as a plurality of read data to set in the plurality of sub scan chains in a restore mode.

Here, the storing may be achieved by storing the plurality of sub internal state data as the plurality of write data in the memory through a bus interface section as said plurality of write data in the save mode. The reading out may be achieved by reading out the plurality of sub internal state data from the memory through the bus interface section as said plurality of read data to set in the sub scan chains in the restore mode.

Also, when the plurality of input data include a previous stage write data outputted from the sub scan chain of a stage previous to the sub scan chain of a current stage, as one of the plurality of write data, and a current stage read data as one of the plurality of read data which corresponds to the sub scan chain of the current stage, one of the previous stage write data and the current stage read data is selected.

Also, when the plurality of input data include a previous stage write data outputted from the sub scan chain of a stage previous to the sub scan chain of a current stage, as one of the plurality of write data, a current stage read data as one of the plurality of read data which corresponds to the sub scan chain of the current stage, and a current stage write data which is outputted from the sub scan chain of the current stage as one of the plurality of write data, the selecting may be achieved by selecting one of the previous stage write data, the current stage read data, and the current stage write data.

Also, the operation method may be achieved by further issuing a first control signal after the internal state data is set to the plurality of sub scan chains; and supplying power to the target surface in response to the first control signal.

Also, the operation method may be achieved by further issuing a second control signal after the internal state data is stored in the memory; and stopping the power supply to the target circuit in response to the second control signal.

DESCRIPTION OF THE PREFERRED
EMBODIMENTS

Hereinafter, a semiconductor integrated circuit of the present invention will be described with reference to the attached drawings.

Figure 1:
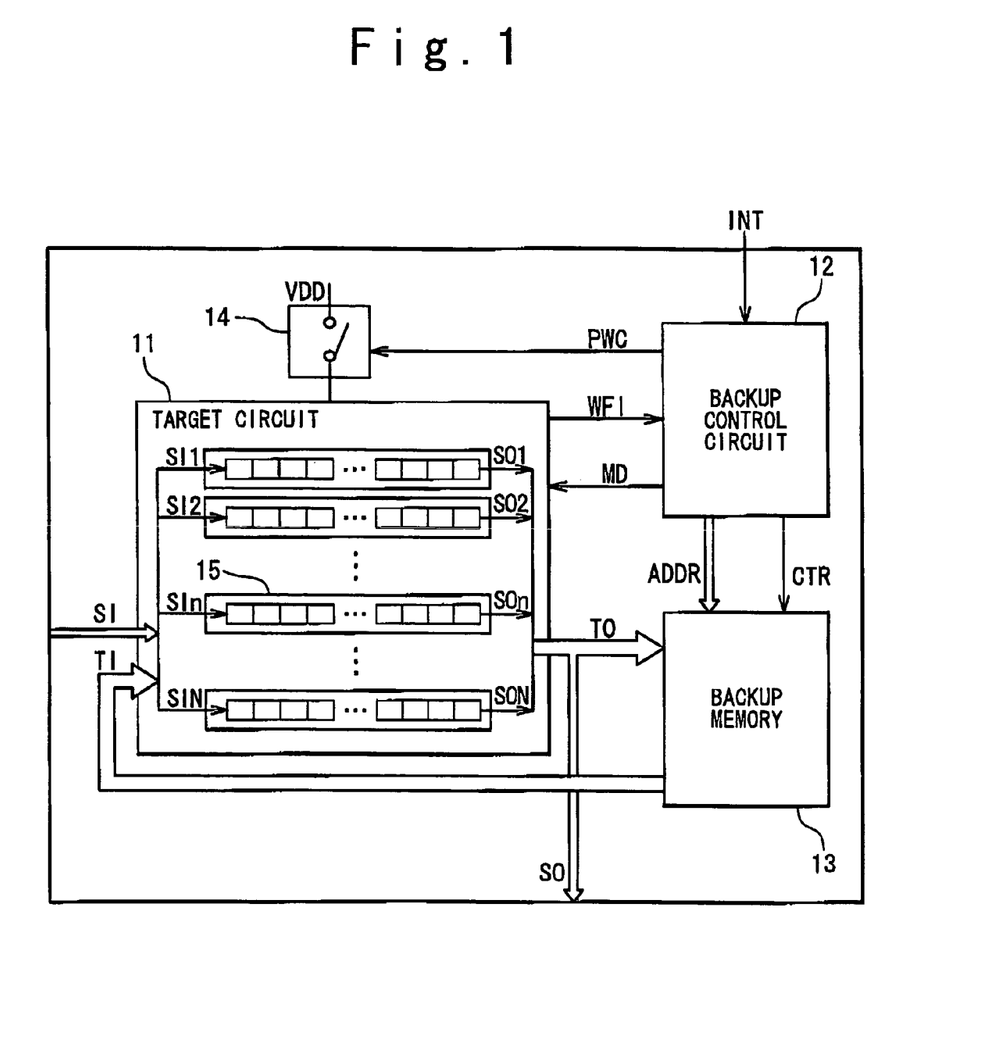
FIG. 1 is a block diagram showing the configuration of a semiconductor integrated circuit according to a first embodiment of the present invention.

FIG. 1 is a block diagram showing the configuration of a semiconductor integrated-circuit according to the first embodiment of the present invention. Referring to FIG. 1, the semiconductor integrated circuit includes a target circuit 11 whose internal state is saved as internal state data, a backup memory 13 which stores the internal state data of the target circuit 11, a backup control circuit 12 which controls a saving operation and restoring operation of the internal state data of the target circuit 11, and a switch 14 which controls power supply of the target circuit 11. The internal state of the target circuit 11 is restored based on internal state data held by flip-flops in the target circuit 11.

The backup control circuit 12 receives an instruction (WFI) from the target circuit 11, switches an operation mode (MD) of the target circuit 11, and saves data indicating the internal state of the target circuit 11, that is, the internal state data in the backup memory 13. Moreover, the backup control circuit 12 is started in response to an external interrupt signal (INT), to set the internal state data stored in the backup memory 13 to the target circuit 11, and to restore the internal state of the target circuit 11. In the saving/restoring operation of this internal state, the backup control circuit 12 controls a storage address (ADDR) of the backup memory 13 and a write/read timing (CTR) of the target circuit 11.

A power supply system of the target circuit 11 is separated from other circuits in the integrated circuit. Therefore, the power supply of only the target circuit 11 can be turned off. The switch 14 turns on/off this power supply on the basis of control (PWC) by the backup control circuit 12.

The backup memory 13 holds the internal state data that indicates the internal state of the target circuit 11. The backup memory 13 is sufficient to have a capacity for the internal state data of the target circuit 11. The data width (word length) is broadened to acquire the internal node data (TO) efficiently. For example, when there are 32 scan chains, if the internal state data of four positions are acquired from each of 32 scan chains, the data of 128 bits is outputted in parallel for every scan clock. Therefore, the word length of 128 bits or more is needed in the backup memory 13. Write/read operation timing CTR and an address ADDR of the backup memory 13 are given from the backup control circuit 12. The backup memory 13 has a high threshold voltage, and a low leakage current. Therefore, although the operation speed of the backup memory 13 is not too fast, power consumption is a little. Moreover, if a nonvolatile memory such as a flash memory is used for the backup memory 13, the power supply of the backup memory 13 can be turned off in the standby state, to reduce the power consumption.

The internal state data that indicates the internal state of the target circuit 11 is supplied and outputted to and from the scan chain 15. The scan chain 15 is used for a scan path test for examining non-defectiveness of the semiconductor integrated circuit. When the scan path is tested in a scan path test mode, the scan chain 15 receives a test data from a scan input SI in serial and outputs a test result from a scan output SO. Although not described here, the backup control circuit 12 and the backup memory 13 may be targets of the scan path test.

The target circuit 11 is a circuit unit having the internal state that should hold in a standby state in a save mode. The target circuit 11 includes therein a circuit for the scan path test to detect a production defect of the target circuit 11. In this circuit for the scan path test, flip-flops are connected in a chain manner upon the test execution, to form a shift register. This shift register is called a so-called scan chain. In the target circuit 11, at least one scan chain 15 is set. Although about 32 scan chains 15 are set in a recent semiconductor integrated circuit, more scan chains may be set, or only one scan chain may be set. Serial data for the scan path test is supplied to a scan input SI (SI1 to SIn to SIN) of each the scan chain 15, and scan path test results data is outputted in serial from the scan output SO (SO1 to SOn to SON) thereof. The input/output of the serial data to/from each scan chain need not be synchronized, and the respective scan chains may operate independently. Hereinafter, the scan chain 15 will be described as a circuit having a scan input SIn and a scan output SOn (where n=1, 2, . . . , N) as an example.

In the target circuit 11, when an internal logic circuit operates, the operating state of sequential circuits (flip-flops) included in the logic circuit is held. That is, the flip-flops hold the internal state of the target circuit 11. An internal state data held in these flip-flops can be saved as the internal state data of the target circuit 11, and the internal state of the target circuit 11 can be restored by setting the internal state data to the flip-flops. On the other hand, when the scan path is tested, the flip-flops form the scan chain 15 and can output the holding data in serial. Moreover, the scan chain 15 receives data in serial and can set the data for the scan path test to the flip-flops. Therefore, the state of the flip-flops can be read and written by using this scan chain 15.

The target circuit 11 outputs the scan output SO from the plurality of scan chains 15 as data TO to the backup memory 13 based on control of the backup control circuit 12. When the data held in all the flip-flops of the target circuit 11 are outputted, the internal state of the target circuit 11 is saved in the backup memory 13. Moreover, the target circuit 11 takes therein data TI outputted from the backup memory 13 and sets them to the scan chains 15 based on the control of the backup control circuit 12. When the data are set to the scan chains 15, the internal state of the target circuit 11 is restored. When the target circuit 11 is switched from a restoring state to a normal operating state, the target circuit 11 returns to a normal operation.

Figure 2:
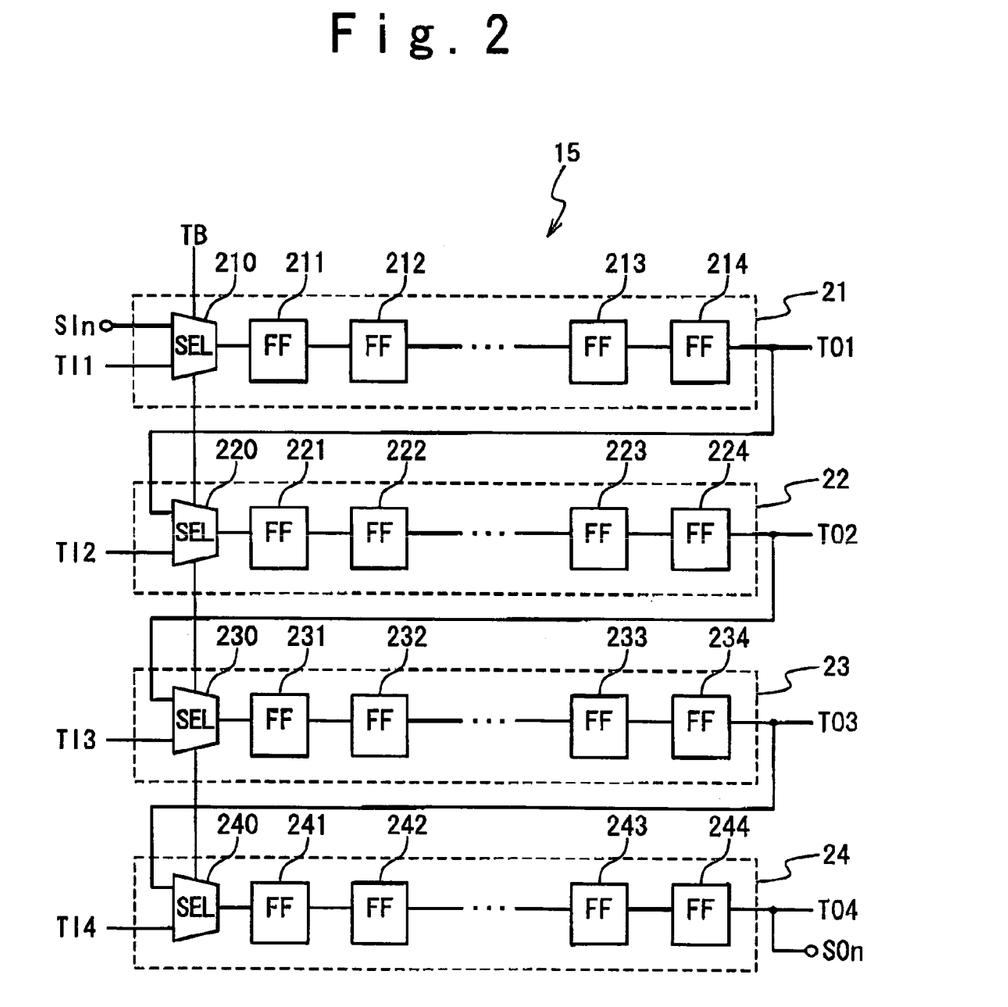
FIG. 2 is a block diagram showing the configuration of a scan chain in a target circuit of the semiconductor integrated circuit according to the first embodiment of the present invention.

FIG. 2 shows the configuration of the scan chain 15 when the scan chain is valid. The scan chain 15 is one chain constituted by connecting a plurality of registers upon the scan test. The chain is divided into sub scan chains. That is, the scan chain 15 includes a plurality of sub scan chains. In this example, it is supposed that the scan chain 15 includes four sub scan chains 21, 22, 23 and 24. The sub scan chains 21, 22, 23 and 24 include flip-flops for a same number, respectively. The sub scan chains 21, 22, 23 and 24 are cascade-connected, and operate as one scan chain 15 when the scan path is tested. When the internal state data is received as a plurality of sub internal state data, the sub scan chains 21, 22, 23 and 24 operate in parallel, and receive the plurality of sub internal state data at the same time. The sub scan chain 21 includes a selector circuit 210 and flip-flops 211 to 214. Similarly, the sub scan chain 22 includes a selector circuit 220 and flip-flops 221 to 224, the sub scan chain 23 includes a selector circuit 230 and flip-flops 231 to 234, and the sub scan chain 24 includes a selector circuit 240 and flip-flops 241 to 244. Each of the selector circuits 210, 220, 230 and 240 selects and outputs one of two input signals on the basis of a selection signal TB.

In the sub scan chain 21, the selector circuit 210 receives the scan input SIn and the sub internal state data TI1 from the backup memory 13. The selector circuit 210 selects and outputs the data from the scan input SIn when the scan path is tested, and selects and outputs the sub internal state data TI1 in response to the selection signal TB when the internal state data is restored. The flip-flops 211 to 214 are connected in a chain manner to form a shift register, and receive the output of the selector circuit 210. The output of the flip-flop 214 is connected as the sub internal state data TO1, and sent to the sub scan chain 22 in the next stage.

In the sub scan chain 22, the selector circuit 220 receives the sub internal state data TO1 from the sub scan chain 21 in the former stage and the sub internal state data TI2 for a current stage from the backup memory 13. The selector circuit 220 selects and outputs the sub internal state data TO1 from the former stage when the scan path is tested, and selects and outputs the sub internal node data TI2 from the memory 13 when the sub internal state data is restored, on the basis of the selection signal TB. The flip-flops 221 to 224 are connected in a chain manner to form the shift register, and received the output of the selector circuit 220. The output of the flip-flop 224 is connected as sub internal state data TO2, and sent to the sub scan chain 23 in the next stage.

Similarly, in the sub scan chain 23, the selector circuit 230 receives the sub internal state data TO2 from the sub scan chain 22 in the former stage and sub internal state data TI3 from the backup memory 13. The selector circuit 230 selects and outputs the output data TO2 of the former stage when the scan path is tested, and selects and outputs sub internal state data TI3 from the backup memory 13 when the internal state is restored, on the basis of selection signal TB. The flip-flops 231 to 234 are connected in a chain manner to form the shift register, and receive the output of the selector circuit 230. The output of the flip-flop 234 is connected as the sub internal state data TO3, and sent to a sub scan chain 24 in the next stage.

Similarly, in the sub scan chain 24, the selector circuit 240 inputs the output data TO3 of the sub scan chain 23 in the former step and internal state data TI4 stored in the backup memory 13. The selector circuit 240 selects and outputs the output data TO3 from the former stage when the scan path is tested, and selects and outputs the internal state data TI4 from the memory 13 when the internal state is saved/restored, on the basis of the selection signal TB. The flip-flops 241 to 244 are connected in a chain manner to form the shift register, and receive the output of the selector circuit 240. The output of the flip-flop 244 is outputted as the internal state data TO4, and output as the output SOn of the scan chain 15.

Next, the operation of the scan chain 15 will be described. When an original function of the target circuit 11 is executed, the flip-flops 211 to 214, the flip-flops 221 to 224, the flip-flops 231 to 234, and the flip-flops 241 to 244 as the register of the internal logic circuit hold the internal state of the target circuit 11 as the internal state data.

The flip-flops in the target circuit 11 are connected to constitute the scan chain 15 upon the scan path test as shown in FIG. 2. In fact, the signal selection of a selecting circuit (not shown) built in the flip-flop is switched to form the scan chain. The selector circuits 210, 220, 230 and 240 are set to select data on the scan chain side in response to the selection signal TB. Therefore, the flip-flops included in the sub scan chains 21 to 24 form a shift register. The scan data is received from the scan input SIn, and is shifted on the flip-flops sequentially toward the scan output Son in synchronization with a scan clock signal. When the scan data is set to all the flip-flops, each flip-flop is released from the scan chain 15 once, and takes therein data of the original internal logic circuit in the target circuit 11. At this time, since each flip-flop outputs the scan data, each flip-flop holds a result of the scan path test. Then, the flip-flops return to the scan chain 15. The shift register outputs the result data of the scan path test from the scan output SOn on the basis of the scan clock.

When the internal state data is saved in a save mode, the scan chain 15 is set so that the sub scan chains 21 to 24 operate in parallel. The selection signal TB is set to select the sub internal state data (TI) of the backup memory 13 in this example, although it may be set to either. The internal state data held in the flip-flops are sequentially outputted to the backup memory 13 in parallel as the sub internal state data TO1 to TO4 of the sub scan chains in synchronization with a clock signal in the same manner when the scan path is tested. The address ADDR of the backup memory 13 is updated by the backup control circuit 12 in synchronization with the clock signal. Then, the sub internal state data TO1 to TO4 of the sub scan chains are sequentially stored in the backup memory 13. If the sub internal state data are outputted for the number of the flip-flops of the sub scan chains, the saving operation of the whole of internal state data of this scan chain 15 to the backup memory 13 is completed. Therefore, the output time can be shortened, compared with a case where only the internal state data SOn of the scan chain 15 are connected with the memory 13. As shown in FIG. 2, when the scan chain 15 is divided into four sub scan chains 21 to 24, the output time is reduced to ¼.

When the internal state data is restored, that is, when the sub internal state data held in the backup memory 13 is set to the original flip-flops, the scan chain 15 is set so that the sub scan chains 21 to 24 operate in parallel. The selection signal TB is set to select the sub internal state data TI from the backup memory 13. The sub internal state data TI1 to TI4 are supplied from the backup memory 13 to the sub scan chains 21 to 24. The backup control circuit 12 updates the address ADDR of the backup memory 13 in synchronization with the clock signal from a default value, such that the sub internal state data TI1 to TI4 are supplied to the sub scan chains 21 to 24 in the order of saving. The sub internal state data TI1 to TI4 supplied to the sub scan chains 21 to 24 are shifted on the sub scan chains of the shift register through the selector circuits 210, 220, 230 and 240 toward the outputs TO1 to TO4. When the sub internal state data TI1 to TI4 are shifted for the number of flip-flops in the sub scan chains, the original internal state data are set to the flip-flops. Thus, the internal state of the target circuit 11 is restored. Then, when the restoring operation is ended, the target circuit 11 returns to a normal operation.

Figure 3:
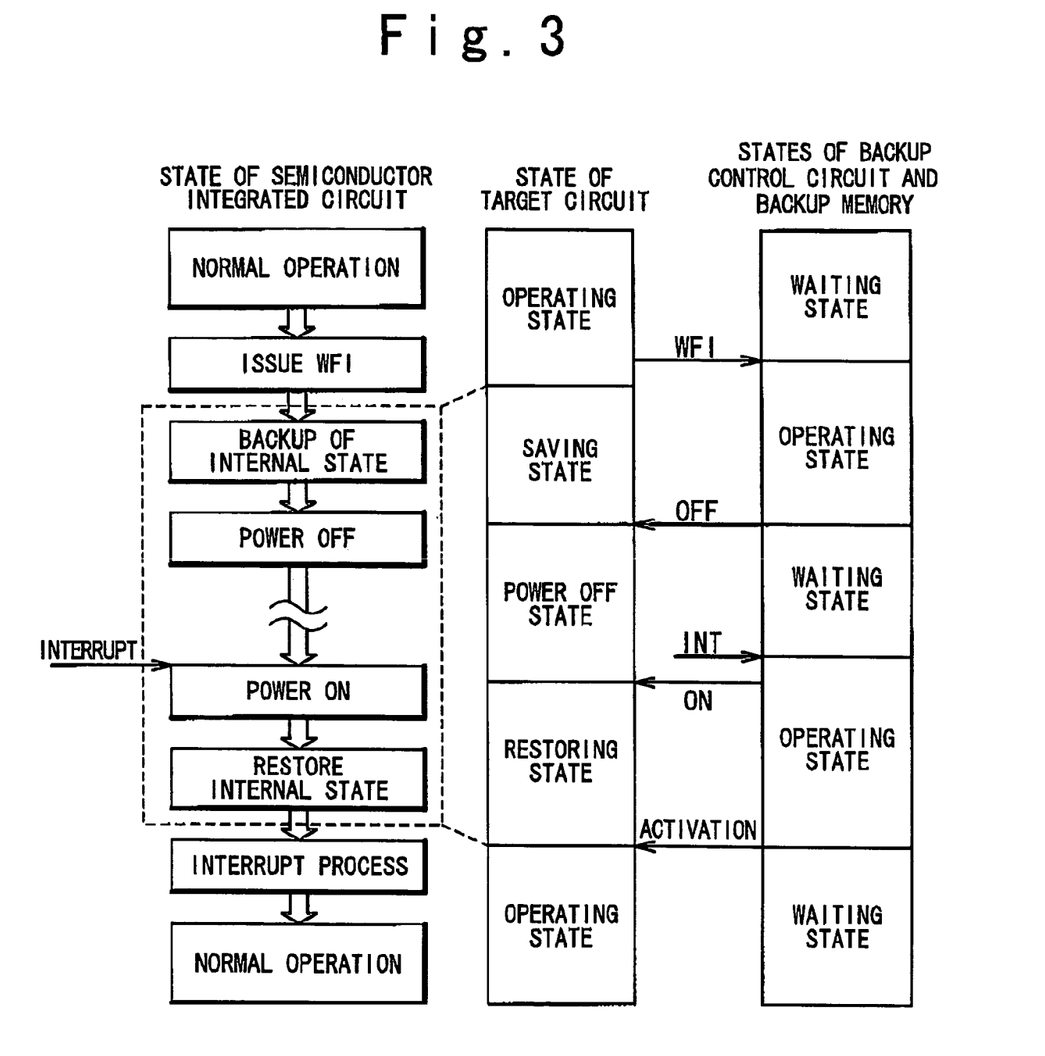
FIG. 3 is a diagram showing an operating state of the semiconductor integrated circuit according to the first embodiment of the present invention.

Referring to FIG. 3, an operation of the semiconductor integrated circuit will be described in which the internal state data is save in the backup memory 13 by using the scan chain or the sub scan chains, and the internal state data is restored from the backup memory 13. Here, it is assumed that the target circuit 11 is a Central Processing Unit (CPU) built in the semiconductor integrated circuit, and the processing state of software executed by the CPU as a state of the target circuit 11 will be described. The operation state of the semiconductor integrated circuit in the viewpoint of the software is shown on the left side of FIG. 3. The operation states of the target circuit 11, the backup control circuit 12 and the backup memory 13 in the viewpoint of hardware of the semiconductor integrated circuit are shown on the right side of FIG. 3.

The semiconductor integrated circuit is sometimes set to a waiting state due to a periodic process, a man-machine interface process, and so on in a normal operation. At that time, the CPU 11 executes a Wait for Interrupt (WFI) instruction and goes to the waiting state. Usually, the execution of the software is stopped in the waiting state. In that case, hardware reduces the power supply voltage to a standby voltage for reduction of the power consumption. The hardware can restart the execution of the software immediately when an interrupt signal INT is received to instruct the process restart. In order to reduce the power consumption, the power supply of the CPU 11 is stopped, and a leakage current in the waiting state is reduced, according to the present invention as shown by the enclosure of a dotted line in FIG. 3. Since the internal state of the CPU 11 is reset when the power supply of the CPU 11 is turned off, the internal state of the CPU 11 is saved in the backup memory 13 before the power supply is turned off.

When the interrupt signal INT is supplied to the backup control circuit 12 to make the CPU 11 restart, the power supply of the CPU 11 is turned on. The internal state of the CPU 11 is restored from the backup memory 13, and the execution of software is restarted. Since the interrupt signal INT is received, the software firstly executes interrupt processing, and then returns to the usual processing. Therefore, the software executes as if the waiting state is maintained irrespective of the on/off of the power supply. That is, since the target circuit (CPU) 11 is in the usual operation state until the WFI instruction is issued, and the software is stopped in response to the WFI instruction, the internal state is frozen. When the WFI instruction is issued, the backup control circuit 12 and the backup memory 13 are activated from the waiting state. The backup control circuit 12 sets the target circuit (CPU) 11 to a saving state in which the scan chain is constituted. The backup control circuit 12 saves the frozen internal state data of the target circuit (CPU) 11 to the backup memory 13. When the whole of internal state data of the target circuit (CPU) 11 is saved, the backup control circuit 12 controls the switch 14 so that the power supply of the target circuit (CPU) 11 is stopped. The backup control circuit 12 shifts to the waiting state until the interrupt signal INT is received. The leakage current is reduced since the circuit scales of the backup control circuit 12 and backup memory 13 are smaller than the target circuit (CPU) 11, to reduce the power consumption.

When the interrupt signal INT is received, the backup control circuit 12 returns from the waiting state to the operating state. First of all, the backup control circuit 12 controls the switch 14 to restart the power supply of the target circuit (CPU) 11. Then, the backup control circuit 12 sets the target circuit (CPU) 11 to the restoring state in which the scan chain is constituted. The backup control circuit 12 supplies the internal state data TI from the backup memory 13 to the sub scan chain, and restores the internal state of the target circuit 11. When the internal state of the target circuit (CPU) 11 is restored to the original state, the backup control circuit 12 releases the target circuit (CPU) 11 from the restoring state, and activates the target circuit (CPU) 11. Thus, the target circuit (CPU) 11 restarts the operation. The backup control circuit 12 and the backup memory 13 go to the waiting state until the WFI instruction is issued next. Here, although the description is made regarding the CPU as the target circuit 11, the target circuit 11 is not limited to the CPU, and may be a random logic circuit. In this way, the serial data is sent to the sub scan chains 21 to 24, and the internal state is recreated. As a result, then the restoration time is shortened. As described above, according to the present invention, saving/restoring of the internal state for a shorter time becomes possible, and the leakage current in the waiting state can be reduced.

Figure 4:
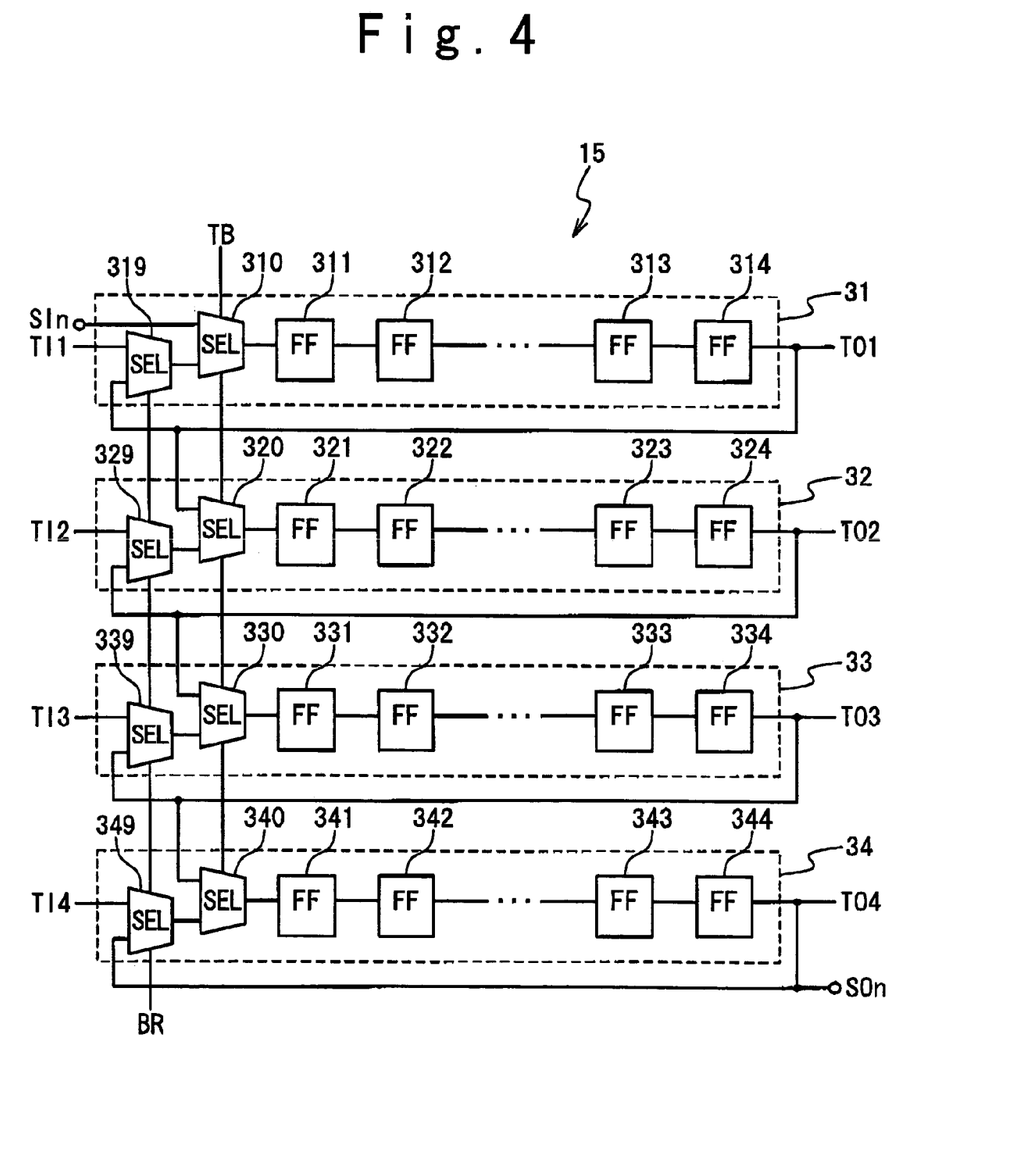
FIG. 4 is a block diagram showing the configuration of the scan chain in the semiconductor integrated circuit according to a second embodiment of the present invention.

FIG. 4 is a block diagram showing the configuration of the scan chain in the semiconductor integrated circuit according to the second embodiment of the present invention to shorten a minimum restoration time. The minimum restoration time is a time required to restore the initial state of the target circuit when the restoration of the internal state data is instructed immediate after the internal state data starts to be saved. In the scan chain 15 shown in FIG. 4, selector circuits are provided for the head portions of the sub scan chains 21 to 24 shown in FIG. 2. This scan chain 15 includes sub scan chains 31, 32, 33 and 34. The sub scan chain 31 includes selector circuits 319 and 310 and flip-flops 311 to 314. Similarly, the sub scan chain 32 includes selector circuits 329 and 320 and flip-flops 321 to 324, the sub scan chain 33 includes selector circuits 339 and 330 and flip-flops 331 to 334, and the sub scan chain 34 includes selector circuits 349 and 340 and flip-flops 341 to 344. The portion of the scan chain 15 other than the selector circuits 319, 329, 339 and 349 is the same as the scan chain shown in FIG. 2.

The selector circuits 319, 329, 339 and 349 select the saved sub internal state data TI supplied from the backup memory 13 or the sub internal state data TO outputted from the sub scan chain on the basis of the selection signal BR, and output the selected data to the selector circuit 310, 320, 330 and 340. In the sub scan chain 31, the selector circuit 319 receives the sub internal state data TI1 supplied from the backup memory 13 and the sub internal state data TO1 outputted from the sub scan chain 31. The selector circuit 319 selects the sub internal state data TO1 when the internal state is saved, and selects and outputs the saved sub internal state data TI1 when the internal state is restored, on the basis of the selection signal BR. The selector circuit 310 receives the scan input SIn and the output data from the selector circuit 319. The selector circuit 310 selects the scan input data SIn when the scan path is tested, and selects the output data from the selector circuit 319 when the internal state data is saved and restored, on the basis of the selection signal TB. The flip-flops 311 to 314 are connected in a chain-manner to form the shift register and receive the output data from the selector circuit 310. The output data from the flip-flop 314 is outputted as the sub internal state data TO1, and sent to the sub scan chain 32 in the next stage.

In the sub scan chain 32, the selector circuit 329 receives the sub internal state data TI2 supplied from the backup memory 13 and the sub internal state data TO2 outputted the sub scan chain 32. The selector circuit 329 selects the sub internal state data TO2 when the internal state is saved, and selects the saved sub internal state data TI2 when the internal state data is restored, on the basis of the selection signal BR. The selector circuit 320 receives the sub internal state data TO1 from the sub scan chain 31 in the former stage and the output data from the selector circuit 329. The selector circuit 320 selects the output data TO1 from the former stage when the scan path is tested, and selects the output data of the selector circuit 329 when the internal state data is saved and restored, on the basis of the selection signal TB. The flip-flops 321 to 324 are connected in a chain manner to form the shift register, and receive the output data from the selector circuit 320. The output data from the flip-flop 324 is outputted as the sub internal state data TO2, and sent to the sub scan chain 33 in the next stage.

Similarly, in the sub scan chain 33, the selector circuit 339 receives the sub internal state data TI3 supplied from the backup memory 13 and the sub internal state data TO3 outputted from the sub scan chain 33. The selector circuit 339 selects the sub internal state data TO3 when the internal state data is saved, and selects the saved sub internal state data TI3 when the internal state is restored, on the basis of the selection signal BR. The selector circuit 330 receives the output-data TO2 from the sub scan chain 32 in the former stage and the output data from the data circuit 339. The selector circuit 330 selects the output data TO2 from the former stage when the scan path is tested, and selects the output data from the selector circuit 339 when the internal state data is saved and restored, on the basis of the selection signal TB. The flip-flops 331 to 334 are connected in a chain manner to form the shift register, and receive the output signal of the selector circuit 330. The output of the flip-flop 334 is outputted as the sub internal state data TO3, and sent to the sub scan chain 34 in the next stage.

Similarly, in the sub scan chain 34, the selector circuit 349 receives the sub internal state data TI4 supplied from the backup memory 13 and the sub internal state data TO4 outputted from the sub scan chain 34. The selector circuit 349 selects the sub internal state data TO4 when the internal state data is saved, and selects the saved sub internal state data TI4 when the internal state data is restored, on the basis of the selection signal BR. The selector circuit 340 receives the output data TO3 from the sub scan chain 33 in the former stage and the output data from the selector circuit 349. The selector circuit 340 selects the output data TO3 from the former stage when the scan path is tested, and selects the output data from the selector circuit 349 when the internal state data is saved and restored, on the basis of the selection signal TB. The flip-flops 341 to 344 are connected in a chain manner to form the shift register, and receive the output signal of the selector circuit 340. The output of the flip-flop 344 is outputted as the sub internal state data TO4, and output as the output SOn of the scan chain 15.

The operation of the scan chain 15 will be described referring to FIGS. 5A, 5B and 5C. When the scan chain is not formed, the flip-flops 311 to 314, the flip-flops 321 to 324, the flip-flops 331 to 334, and the flip-flops 341 to 344 hold the internal state of the target circuit 11.

Figure 5A:
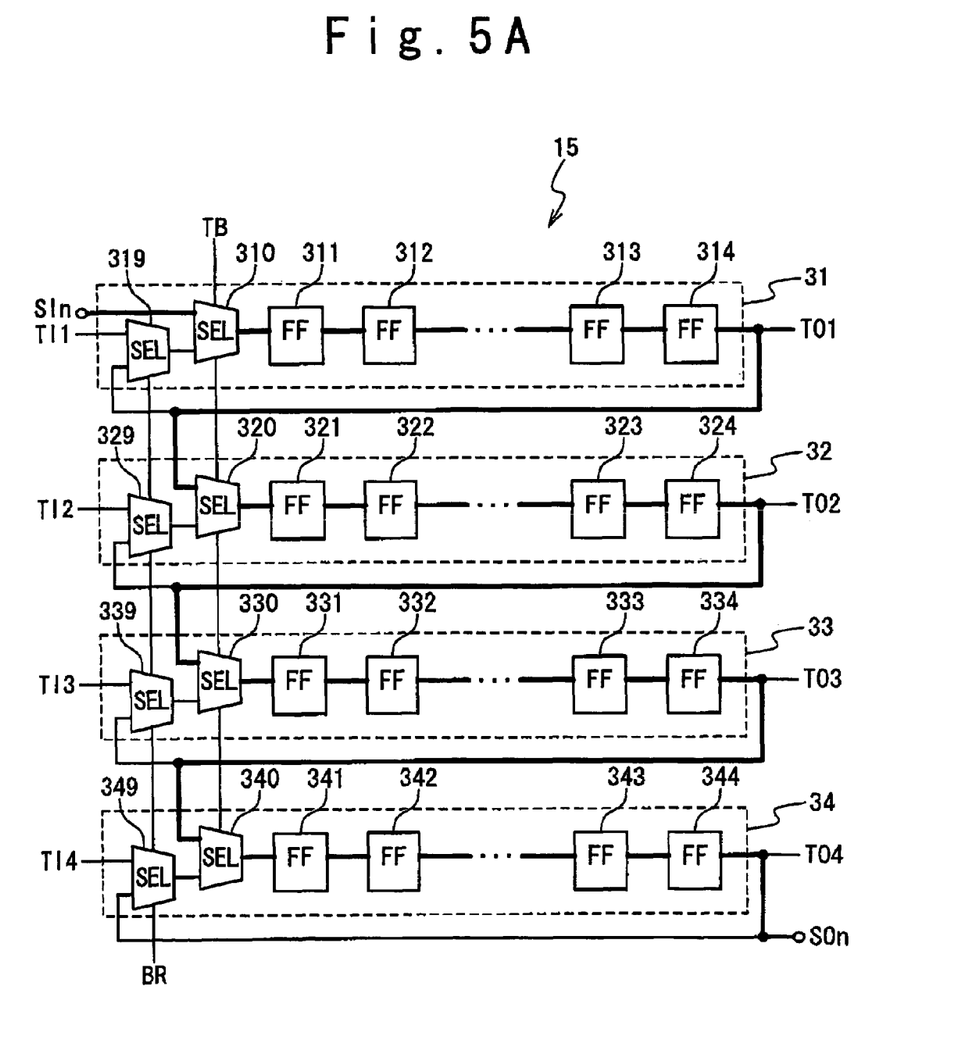
FIG. 5A is a diagram showing an operation when the scan chain in the second embodiment of the present invention.
Figure 5B:
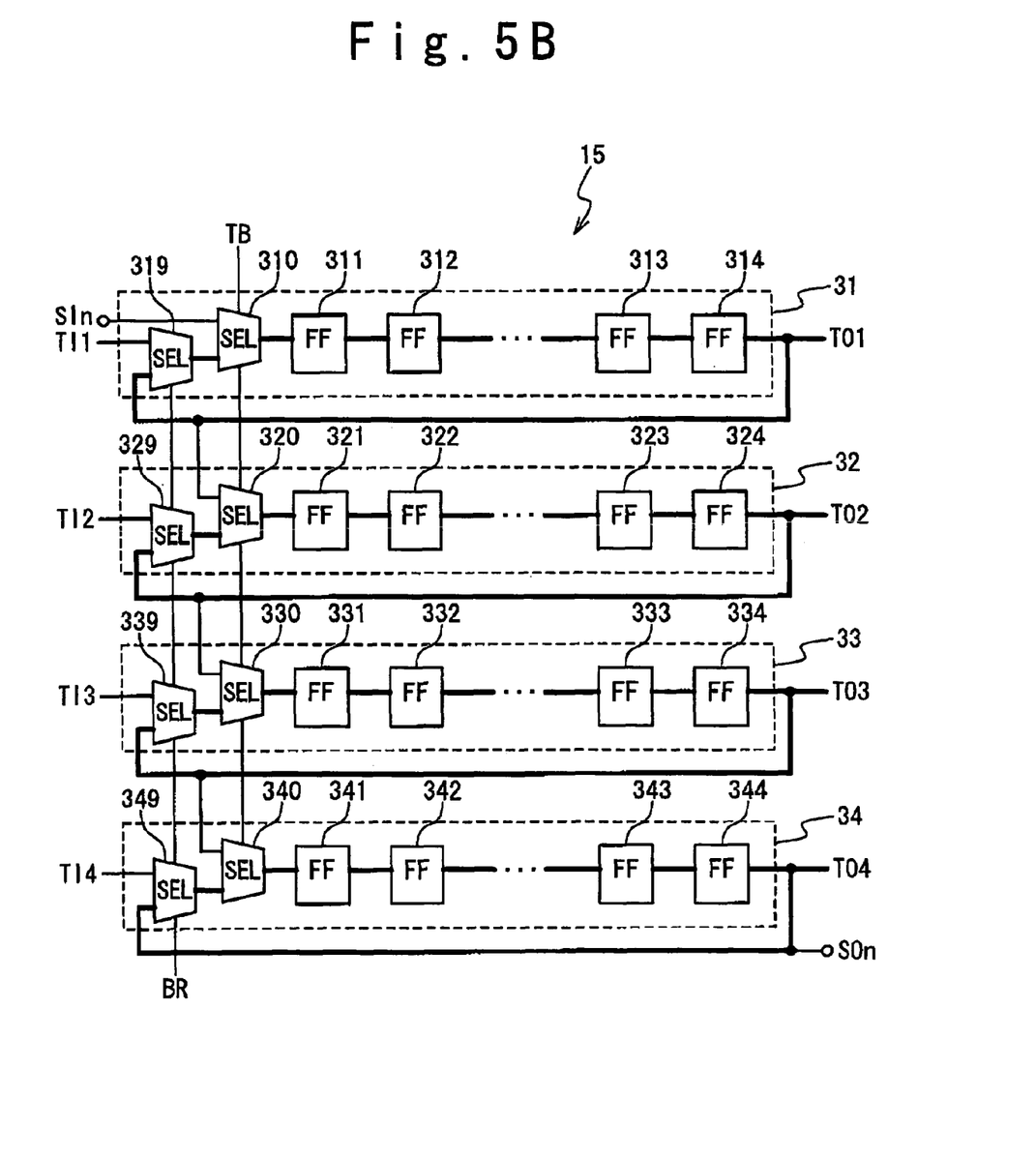
FIG. 5B is a diagram showing another operation when the scan chain in the second embodiment of the present invention.
Figure 5C:
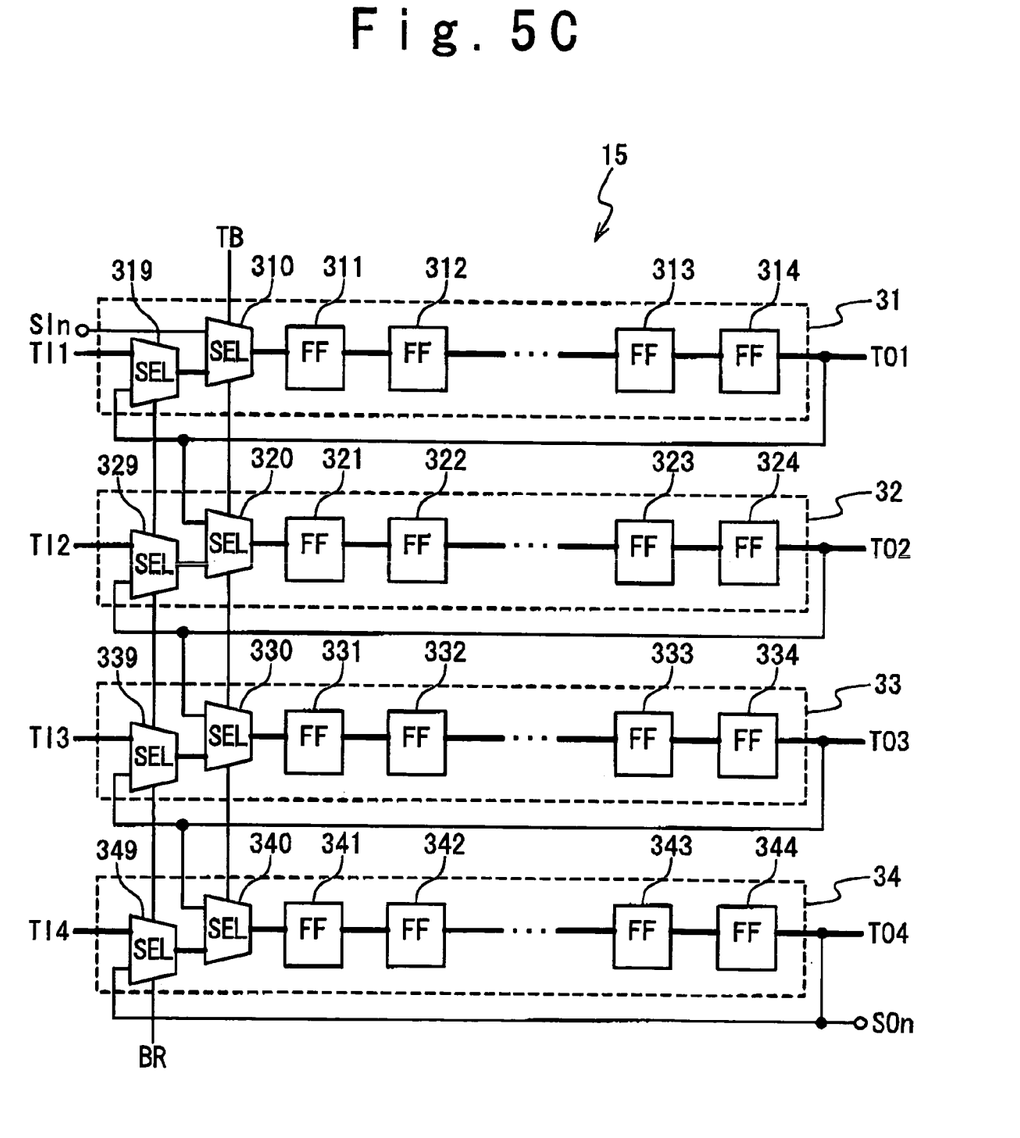
FIG. 5C is a diagram showing another operation when the scan chain in the second embodiment of the present invention.

As shown in FIG. 5A, when the scan path is tested, the flip-flops in the target circuit 11 form the scan chain. In this example, the selection signal TB is set to select the data for the scan path test. However, since the setting of the selection signal BR does not influence the path of the data, both are acceptable. The flip-flops 311 to 314, the flip-flops 321 to 324, the flip-flops 331 to 334, and the flip-flops 341 to 344 form one consecutive shift register. As shown in FIG. 5A by the thick line, the data for the scan path test is supplied from the scan input SIn, and is shifted on the flip-flops sequentially and is set to each flip-flop. When the data for the scan path test is set to each the flip-flop, the scan chain is released once, and the operation check of the internal logic circuit is carried out.

The result is taken in each flip-flop, and then the scan chain is formed again. The check result set to each flip-flop is shifted on the flip-flops and is outputted from the scan output SOn sequentially. Thus, the data is received and outputted in the scan path test.

Next, referring to FIG. 5B, the saving operation will be described in which the internal state data of the target circuit 11 is saved in the backup memory 13. In case of the saving operation of the internal state data, the selector circuits 310, 320, 330 and 340 are set to select the data outputted from the selector circuits 319, 329, 339 and 349 respectively on the basis of the selection signal TB. The selection signal BR is set to select the output data TO1 to TO4 from the sub scan chains 31 to 34. That is, the sub internal state data is shifted to circulate in each sub scan chain as shown in FIG. 5B by the thick line. Therefore, when the whole sub internal state data held by the sub scan chain 31 is outputted as the sub internal state data TO1, the original sub internal state data is set to the flip-flops 311 to 314. Similarly in the sub scan chains 32, 33, and 34, after the whole sub internal state data are outputted, the flip-flops 321 to 324, the flip-flops 331 to 334, and the flip-flops 341 to 344 hold the original sub internal state data. This is just to do the saving operation and the restoring operation of the sub internal state data at the same time. For example, when the interrupt signal INT is supplied while the internal state data of the target circuit 11 is saved in the backup memory 13, so that it is necessary to start the restoring operation, the operation of the target circuit can be restarted at the time when the saving operation is completed. In the configuration of the scan chain 15 shown in FIG. 2, when the saving operation is started once, the whole internal state data is saved in the backup memory 13, and then it is necessary to restore the sub internal state data from the backup memory 13 to the scan chain 15. On the other hand, since the sub internal state data TO1 to TO4 of the sub scan chains 31 to 34 are circulated, the normal operation of the target circuit 11 can be restored immediately after the saving operation becomes completed. Therefore, a time period from the start of the saving operation to the end of the restoring operation can be shortened.

The restoring operation that restores the internal state of the target circuit 11 from the sub internal state data stored in the backup memory 13 will be described referring to FIG. 5C. As described with reference to FIG. 5B, the sub internal state data of the internal state data of the target circuit 11 are sequentially stored in the backup memory 13. When this internal state data is restored in the target circuit 11, the selector circuits 310, 320, 330 and 340 is set to select the data supplied from the selector circuits 319, 329, 339 and 349 respectively on the basis of the selection signal TB. The selection signal BR is set so that the selector circuits 319, 329, 339 and 349 select the sub internal state data TI outputted from the backup memory 13. That is, the sub internal state data TI1 supplied from the backup memory 13 is shifted on the sub scan chain 31 and set to the flip-flops 311 to 314 as shown in FIG. 5C by the thick line. Similarly, the sub internal state data TI2 is shifted on the sub scan chain 32 and set to the flip-flops 321 to 324. The sub internal state data TI3 is shifted on the sub scan chain 33 and set to the flip-flops 331 to 334. The sub internal state data TI4 is shifted on the sub scan chain 34 and set to the flip-flops 341 to 344. In this manner, the sub internal state data held in the backup memory 13 is stored in the flip-flops 311 to 314, the flip-flops 321 to 324, the flip-flops 331 to 334, and the flip-flops 341 to 344, and the target circuit 11 returns to the original internal state. Then, the scan chain is released and the target circuit 11 returns to the normal operation.

In the above-described, although the sub scan chains have been described under the assumption that they include the flip-flops of the same number, the flip-flops included in the scan chain 15 are not necessarily multiples of the number of the sub scan chains. Therefore, when the number of flip-flops included in each sub scan chain is different, it is desired that dummy flip-flops are inserted to hold the internal state data temporarily so that the numbers of the flip-flops in the sub scan chains are same. Also, it is possible to constitute each sub scan chain such that the data are outputted to the backup memory at a same time for the sub scan chains which have a same number of flip-flops. In that case, the number of inserted dummy flip-flops may be a few. Moreover, by changing the number of shift clocks for every sub scan chain, it is possible to save/restore the internal state data of the sub scan chains with the flip-flops of different numbers.

Figure 6:
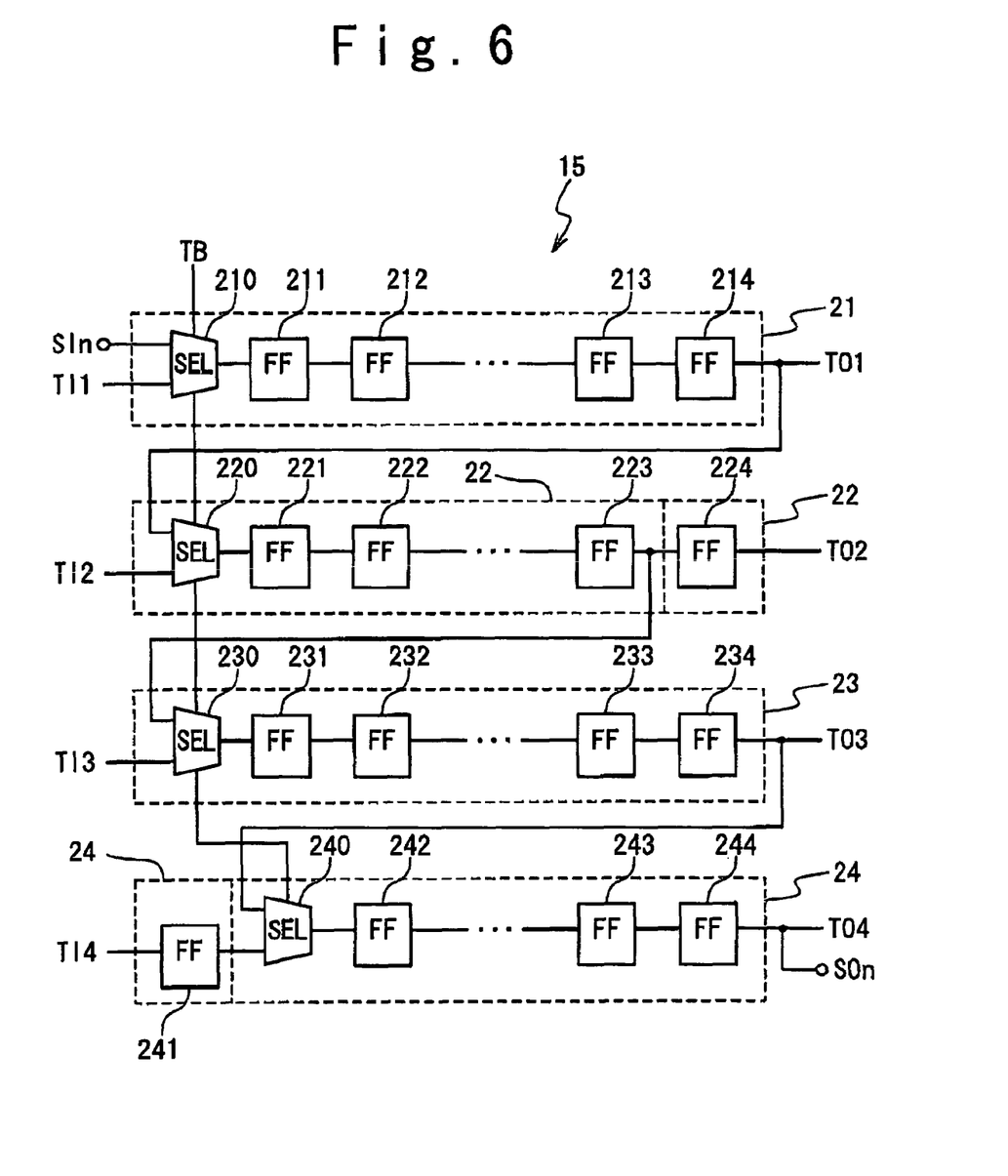
FIG. 6 is a block diagram showing the configuration of the scan chain with dummy flip-flops in the semiconductor integrated circuit according to a third embodiment of the present invention.

FIG. 6 is a block diagram showing an example of the scan chain 15 including the dummy flip-flops in the semiconductor integrated circuit according to the third embodiment of the present invention. This dummy flip-flops belongs to other scan chains, and operate as a part of the other scan chains when the scan path is tested. The scan chain 15 shown in FIG. 6 does not include flip-flops 224 and 241 of the scan chain shown in FIG. 2. That is, the number of flip-flops included in sub scan chains 22 and 24 are less than that of the sub scan chains 21 and 23 in the scan chain 15 shown in FIG. 6. In the sub scan chain 22, a flip-flop 224 (called "dummy flip-flop" hereafter) not included in the scan chain 15 is connected after the flip-flop 223. Therefore, the flip-flop 223 is connected with the dummy flip-flop 224' and the selector circuit 230 of the sub scan chain 23 in the next stage. The dummy flip-flop 224' outputs the output data from the flip-flop 223 to the backup memory 13. Moreover, in the sub scan chain 24, a dummy flip-flop 241' is connected with the selector circuit 240. The sub internal state data TI4 outputted from the backup memory 13 is supplied to the dummy flip-flop 241'. The output of the dummy flip-flop 241' is supplied through the selector circuit 240 to the flip-flops 242 to 244 of which the shift register is composed. Thus, the sub scan chains 22' and 24' including the flip-flops of the same number as in the sub scan chains 21 and 23 are formed by connecting the dummy flip-flops 224' and 241' with the sub scan chains 22 and 24. Therefore, the sub scan chains 21, 22', 23 and 24' become possible to output the sub internal state data of the same number to the backup memory 13. Moreover, the sub scan chains 21, 22', 23 and 24' become possible to take therein the sub internal state data of the same number from the backup memory 13 and to set it to each flip-flop. Here, although the number of the excess or lack flip-flops has been described to be one for the sub scan chain, it may be plural. Moreover, the dummy flip-flop can operate similarly even if the dummy flip-flop is connected before or/and behind the original sub scan chain. Moreover, the second selector circuit is located in the head portion of the sub scan chain with which this dummy flip-flop is connected, and it is also possible to feed back the output of each sub scan chain to the head portion as shown in FIG. 4.

In this way, the number of flip-flops included in the sub scan chain without including the dummy flip-flop in the scan chain when the scan path is tested can be adjusted by connecting the dummy flip-flop. This dummy flip-flop can be contained in the scan chain with the backup control circuit, and can prevent influence to the test of the scan path of the target circuit.

Figure 7:
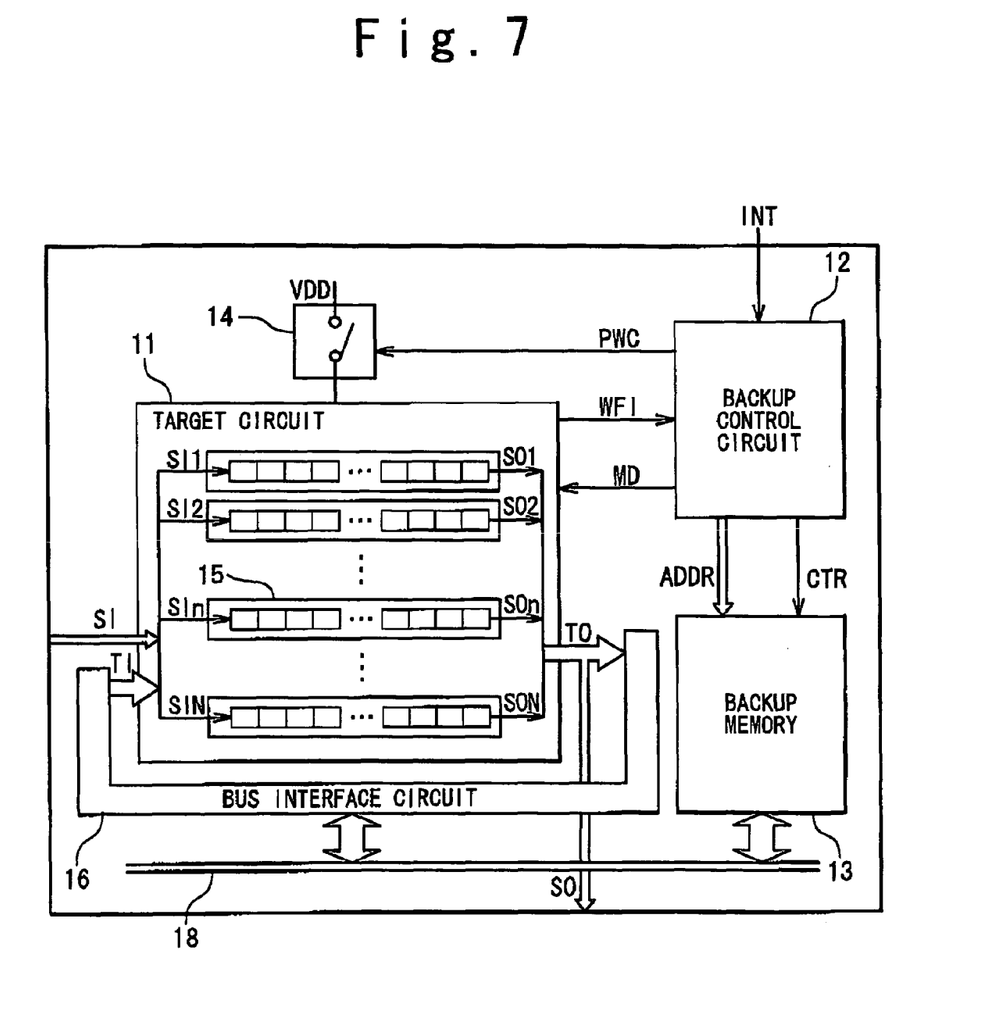
FIG. 7 is a block diagram showing another composition of the semiconductor integrated circuit according to a fourth embodiment of the present invention.

Next, the semiconductor integrated circuit according to the fourth embodiment of the present invention will be described referring to FIG. 7. In the second embodiment, an example of the interface between the scan chain and the backup memory different from the first embodiment will be described. The semiconductor integrated circuit includes the target circuit 11, the backup memory 13, the backup control circuit 12, the switch 14, and a bus interface circuit 16. The target circuit 11 is a circuit that the internal state is saved, and the power supply is controlled by the switch 14. The switch 14 is controlled by the backup control circuit 12. The internal state of the target circuit 11 is put on a system bus 18 by the bus interface circuit 16, and saved in the backup memory 13. Moreover, the internal state stored in the backup memory 13 is put on the system bus 18, and restored to the target circuit 11 through the bus interface circuit 16. The saving/restoring operation of the internal state of the target circuit 11 is controlled by the backup control circuit 12.

The configuration and operation of the target circuit 11 are the same as the circuit shown in FIG. 1. Therefore, when the scan path is tested, the internal state held in the scan chain 15 is outputted as the scan output SO. When the internal state of the target circuit 11 is saved, the internal state data held in the scan chain 15 is sent to the bus interface circuit 16 through the sub scan chains to which the paths is divided. At this time, the internal state data is preferably sent to the bus interface circuit 16 in the data width equal to the data width of bus in the bus interface circuit 16. The bus interface circuit 16 outputs the internal state data to the system bus 18 by adjusting the signal level and the timing of the internal state data. The backup memory 13 takes therein the internal state data from the system bus 18 and stores it in synchronization with this. The address ADDR of the backup memory 13 is supplied from the backup control circuit 12.

When the internal state of the target circuit 11 is restored, the internal state data stored in the backup memory 13 is read out on the basis of the address ADDR outputted from the backup control circuit 12, and sent to the system bus 18. The bus interface circuit 16 takes therein the internal state data from the system bus 18 and supplies the sub internal state data to the sub scan chains of the target circuit 11 as the data TI in synchronization with this. The bus interface circuit 16 adjusts the timing in which sub internal state data is taken therein from the system bus 18 and the conversion of signal level and so on. The sub scan chain executes the operation described in the first embodiment.

Thus, the sub internal state data TO are stored in the backup memory 13 through the system bus 18. Furthermore, the sub internal state data stored in the backup memory 13 are supplied to the target circuit 11 as the internal state data TI through the system bus 18. Thus, the target circuit 11 returns to the original internal state.

It is also possible that the semiconductor integrated circuit uses a part of the system memory connected with the system bus 18 as the backup memory 13 by saving the internal state data of the target circuit 11 through the system bus 18 and restoring it from the backup memory 13. In that case, the backup control circuit 12 accesses the memory on the basis of the interface specification of the system bus 18.

Moreover, the backup memory 13 may be the outside of the semiconductor integrated circuit with the target circuit 11 if it is accessible to the system memory through the system bus 18. That is, degree of freedom of the selection of the memory used as the backup memory is improved by supporting by the general-purpose interface.

As the above described, the internal state data of the target circuit 11 is saved and restored in a short time by dividing the scan chain into the sub scan chains. Furthermore, since the internal state of the target circuit 11 is held outside the semiconductor integrated circuit, the power supply of the target circuit 11 can be stopped, and the power consumption can be reduced. Moreover, the time of the restoring operation that responds to the discontinuance of the saving operation of the internal state can be further shortened by inserting the selector circuit in the head portion of the sub scan chain and feeding back the output of the sub scan chains.

According to the present invention, the semiconductor integrated circuit and the method for controlling thereof to which the saving and restoring operations of the internal state is shortened can be provided by dividing the scan chain into a plurality of sub scan chains and storing the outputs of the sub scan chains in the memory in parallel.

As described above, although the embodiments and modifications of the present invention have been described, the embodiments and modifications may be combined under the condition of no discrepancy.

What is claimed is:

1. A semiconductor integrated circuit comprising:
   a target circuit which comprises at least a scan chain having sub scan chains of stages to sequentially shift a test data in response to a clock signal in a scan path test mode, each of said sub scan chains comprising first flip-flops connected in series; and
   a backup control circuit configured to control said target circuit and a memory such that a plurality of sub internal state data, corresponding with said sub scan chains, indicating an internal state of said target circuit are stored as a plurality of write data in said memory in a save mode from said sub scan chains and said plurality of sub internal state data are read out from said memory as a plurality of read data and set in said sub scan chains in a restore mode.

2. The semiconductor integrated circuit according to claim 1, wherein said memory is contained in said semiconductor integrated circuit.

3. The semiconductor integrated circuit according to claim 1, further comprising a bus interface section, and
   wherein said backup control circuit controls said target circuit and said memory such that said plurality of sub internal state data are extracted from the sub scan chains and are stored as said plurality of write data in said memory through said bus interface section in the save mode and said plurality of sub internal state data are read out from said memory as said plurality of read data through said bus interface section and set in said sub scan chains in the restore mode.

4. The semiconductor integrated circuit according to claim 1, wherein each of said plurality of sub scan chains comprises:
   a selector section configured to select one of a plurality of inputs data which include a previous stage write data which is outputted from said sub scan chain of a stage previous to said sub scan chain of a current stage as one of said plurality of write data, and a current stage read data as one of said plurality of read data which corresponds to said sub scan chain of said current stage; and
   said first flip-flops connected in series after said selector section and configured to shift the selected data by said selector section in response to said clock signal.

5. The semiconductor integrated circuit according to claim 4, wherein said selector section selects one of said previous stage write data, said current stage read data, and a current stage write data which is outputted from said sub scan chain of said current stage as one of said plurality of write data.

6. The semiconductor integrated circuit according to claim 5, wherein said selector section comprises:

a first selector circuit configured to select one of said current stage read data and said current stage write data; and a second selector circuit configured to select one of said previous stage write data and the selected data by said first selector circuit.

7. The semiconductor integrated circuit according to claim 4, wherein numbers of said first flip-flops are the same over said plurality of sub scan chains.

8. The semiconductor integrated circuit according to claim 4, further comprising second flip-flops added to some of said plurality of sub scan chains such that the number of said flip-flops become the same over said plurality of sub scan chains.

9. The semiconductor integrated circuit according to claim 8, wherein at least one of said second flip-flops is added after said first flip-flops.

10. The semiconductor integrated circuit according to claim 8, wherein at least one of said second flip-flops is added before said selector section.

11. The semiconductor integrated circuit according to claim 4, wherein said plurality of sub scan chains output said plurality of write data to said memory at a same time.

12. A semiconductor integrated circuit comprising:

a target circuit which comprises at least a scan chain having sub scan chains of stages to sequentially shift a test data in response to a clock signal in a scan path test mode, each of said sub scan chains comprising first flip-flops connected in series; and a backup control circuit configured to control said target circuit and a memory such that a plurality of sub internal state data indicating an internal state of said target circuit are stored as a plurality of write data in said memory in a save mode through said sub scan chains and said plurality of sub internal state data are read out from said memory as a plurality of read data and set in said sub scan chains in a restore mode, wherein each of said plurality of sub scan chains comprises:

a selector section configured to select one of a plurality of inputs data which include a previous stage write data which is outputted from said sub scan chain of a stage previous to said sub scan chain of a current stage as one of said plurality of write data, and a current stage read data as one of said plurality of read data which corresponds to said sub scan chain of said current stage; and said first flip-flops connected in series after said selector section and configured to shift the selected data by said selector section in response to said clock signal, wherein a number of pulses of said clock signal supplied to each of said plurality of sub scan chains is determined based on the number of first flip-flops in said sub scan chain, when numbers of said first flip-flops of said plurality of sub scan chains are different.

13. A semiconductor integrated circuit comprising:

a target circuit which comprises at least a scan chain having sub scan chains of stages to sequentially shift a test data in response to a clock signal in a scan path test mode, each of said sub scan chains comprising first flip-flops connected in series; and a backup control circuit configured to control said target circuit and a memory such that a plurality of sub internal state data indicating an internal state of said target circuit are stored as a plurality of write data in said memory in a save mode through said sub scan chains and said plurality of sub internal state data are read out from said memory as a plurality of read data and set in said sub scan chains in a restore mode;

a switch configured to supply power to said target circuit when said switch is turned on in response to a first control signal, and to stop the power supply when said switch is turned off in response to a second control signal, wherein said backup control circuit issues said second control signal to said switch after said internal state data is stored in said memory, and wherein each of said plurality of sub scan chains comprises:

a selector section configured to select one of a plurality of inputs data which include a previous stage write data which is outputted from said sub scan chain of a stage previous to said sub scan chain of a current stage as one of said plurality of write data, and a current stage read data as one of said plurality of read data which corresponds to said sub scan chain of said current stage; and said first flip-flops connected in series after said selector section and configured to shift the selected data by said selector section in response to said clock signal.

14. The semiconductor integrated circuit according to claim 13, wherein said backup control circuit issues said first control signal to said switch after said internal state data is set to said plurality of sub scan chains.

15. An operation method of a semiconductor integrated circuit, comprising:

selecting one of a plurality of input data in each of a plurality of sub scan chains of a scan chain of a target circuit which sequentially shifts a test data in response to a clock signal in a scan path test mode;

storing a plurality of sub internal state data of a data indicating an internal state of said target circuit into a memory from said plurality of sub scan chains as a plurality of write data in a save mode; and reading out said plurality of sub internal state data from said memory as a plurality of read data to set in said plurality of sub scan chains in a restore mode.

16. The operation method according to claim 15, wherein said storing comprises:

storing said plurality of sub internal state data in said memory as said plurality of write data through a bus interface section in the save mode, and said reading out comprises:

reading out said plurality of sub internal state data from said memory as said plurality of read data through said bus interface section to set in said sub scan chains in the restore mode.

17. The operation method according to claim 15, wherein said plurality of input data include a previous stage write data outputted from said sub scan chain of a stage previous to said sub scan chain of a current stage, as one of said plurality of write data, and a current stage read data as one of said plurality of read data which corresponds to said sub scan chain of said current stage, and said selecting comprises:

selecting one of said previous stage write data and said current stage read data.

18. The operation method according to claim 15, wherein said plurality of input data include a previous stage write data outputted from said sub scan chain of a stage previous to said sub scan chain of a current stage, as one of said plurality of write data, a current stage read data as one of said plurality of read data which corresponds to said sub scan chain of said current stage, and a current stage write data which is outputted from said sub scan chain of said current stage as one of said plurality of write data, and said selecting comprises:
selecting one of said previous stage write data, said current stage read data, and said current stage write data.

19. An operation method of a semiconductor integrated circuit, comprising:
selecting one of a plurality of input data in each of a plurality of sub scan chains of a scan chain of a target circuit which sequentially shifts a test data in response to a clock signal in a scan path test mode;
storing a plurality of sub internal state data of a data indicating an internal state of said target circuit into a memory from said plurality of sub scan chains as a plurality of write data in a save mode;
reading out said plurality of sub internal state data from said memory as a plurality of read data to set in said plurality of sub scan chains in a restore mode;
issuing a first control signal after said internal state data is set to said plurality of sub scan chains; and
supplying power to said target surface in response to said first control signal.

20. The operation method according to claim 19, further comprising:
issuing a second control signal after said internal state data is stored in said memory; and
stopping the power supply to said target circuit in response to said second control signal.

21. A semiconductor integrated circuit comprising:
a target circuit having a plurality of flip-flops to execute a predetermined function in a normal mode, forming a scan chain including said plurality of flip-flops to check said predetermined function by using said scan chain in a scan path test mode, and writing a data which said plurality of flip-flops hold in a normal mode into a memory via said scan chain in a save mode,
wherein said scan chain outputs said data in said save mode from an output port of said scan chain to both said memory and an input port of said scan chain.

22. The semiconductor integrated circuit according to claim 21, wherein said target circuit retrieves said data in a restore mode which said scan chain writes in said save mode into said memory, and said input port of said scan chain receives said data to be retrieved in said restore mode without receiving said data from said output port of said scan chain.

23. The semiconductor integrated circuit according to claim 22, wherein said scan chain includes a first flip-flop coupled between said output port of said scan chain and said input port of said scan chain as one of said plurality of flip-flops forming said scan chain, said first flip-flop outputs said data in said save mode from said output port to both said memory and said input port, and said restore mode is completed before said first flip-flop receives said data to be retrieved in said restore mode.

24. The semiconductor integrated circuit according to claim 22, wherein said scan chain includes a first flip-flop coupled between said output port of said scan chain and said input port of said scan chain as one of said plurality of flip-flops forming said scan chain and a second flip-flop coupled between said output port and said first flip-flop as another one of said plurality of flip-flops forming said scan chain,
said first flip-flop receives said data to be retrieved in said restore mode via said input port, and
said second flip-flop receives said data to be retrieved in said restore mode via another input port coupled to said second flip-flop.

25. The semiconductor integrated circuit according to claim 24, wherein said first and second flip-flops receive said data to be retrieved in parallel.

26. A semiconductor integrated circuit comprising:
a target circuit having a plurality of flip-flops to execute a predetermined function in a normal mode, forming a scan chain including said plurality of flip-flops to check said predetermined function by using said scan chain in a scan path test mode, and writing a data which said plurality of flip-flops hold in a normal mode into a memory via said scan chain in a save mode,
wherein said scan chain outputs said data in said save mode from an output port of said scan chain to both said memory and an input port of said scan chain, and
wherein said scan chain includes:
a first flip-flop coupled between said input port and said output port as one of said plurality of flip-flops forming said scan chain,
a second flip-flop coupled between said first flip-flop and said input port as another of said plurality of flip-flops forming said scan chain,
a third flip-flop coupled between said first and second flip-flops as a further one of said plurality of flip-flops forming said scan chain, and
said third flip-flop outputs said data in said save mode from another output port coupled to said third flip-flop to both said memory and another input port coupled to said second flip-flop without intervening said first flip-flop.

27. The semiconductor integrated circuit according to claim 26, wherein said scan chain further includes a fourth flip-flop coupled between said output port of said scan chain and said first flip-flop as one of said plurality of flip-flops and a fifth flip-flop coupled between said first and third flip-flops as one of said plurality of flip-flops, and
said first flip-flop outputs said data in said save mode from a further output port coupled to said first flip-flop to both said memory and a further input port coupled to said fifth flip-flop without intervening said fourth flip-flop.

28. The semiconductor integrated circuit according to claim 27, wherein said first and third flip-flops output said data in said save mode in parallel.

29. The semiconductor integrated circuit according to claim 27, wherein the number of flip-flops between said first and fifth flip-flops and the number of flips-flops between said second and third flip-flops are the same.

30. The semiconductor integrated circuit according to claim 27, wherein each of said first and third flip-flops receives a different clock signal.

31. A semiconductor integrated circuit, comprising:
a target circuit having a plurality of flip-flops to execute a predetermined function in a normal mode, forming a scan chain including said plurality of flip-flops to check said predetermined function by using said scan chain in a scan path test mode, and writing data which said plurality of flip-flops hold in a normal mode into a memory via said scan chain in a save mode,
wherein said scan chain includes a first one of said plurality of flip-flops and a second one of said plurality of flip-flops, said first one of said plurality of flip-flops shifting said data toward said second one of said plurality of flip-flops in said save mode, and
wherein said second one of said plurality of flip-flops transmits said data to said first one of said plurality of flip-flops in said save mode.

* * * * *